(12) United States Patent
Yang et al.

(10) Patent No.: US 6,218,084 B1
(45) Date of Patent: Apr. 17, 2001

(54) METHOD FOR REMOVING PHOTORESIST LAYER

(75) Inventors: Chan-Lon Yang, Taipei; Tong-Yu Chen, Hsinchu; Michael W C Huang, Taipei Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/212,727

(22) Filed: Dec. 15, 1998

(51) Int. Cl.$^7$ .................................................. G03F 7/42
(52) U.S. Cl. .............................. 430/329; 134/1.1; 134/1.2
(58) Field of Search ...................... 430/329; 134/1.1, 134/1.2

(56) References Cited

U.S. PATENT DOCUMENTS 5,908,319 * 6/1999 Xu ................................................ 438/725
5,908,735 * 6/1999 Kim ............................................... 430/329
6,040,110 * 3/2000 Shirai ............................................. 430/258

* cited by examiner

Primary Examiner—Mark F. Huff
Assistant Examiner—Nicole Barreca
(74) Attorney, Agent, or Firm—Oppenheimer Wolff & Donnelly, LLP

(57) ABSTRACT

A method described for removing a photoresist/polymers layer on a substrate. The method comprises the steps of providing a wafer having an oxide layer, a photoresist/polymers layer, an opening penetrating through the photoresist/polymers layer and the oxide layer, and the sidewall polymer on the surface of photoresist layer and the oxide layer. An in-situ plasma-etching step using an additional gas mixed with oxygen as source is performed to remove the photoresist/polymers layer without residues, no damages to substrate and oxide and no changes on the critical dimension of the opening during etching step.

10 Claims, 3 Drawing Sheets

METHOD FOR REMOVING PHOTORESIST LAYER

BACKGROUND OF THE INVENTION

1. Field of the Invention

The present invention relates to a method for removing a photoresist layer and polymers layer in the fabrication of a semiconductor device. More particularly, the present invention relates to a high-density plasma method using mixing gases as source for removing a photoresist layer and polymers layer generated during plasma etching process.

2. Description of the Related Art

In the fabrication procedure of a metal oxide semiconductor (MOS), photoresist layers are widely used in patterning processes. However, after an etching step is performed, the photoresist layer and the sidewall polymers generated during plasma etching step needs to be removed for subsequent processes. When the photoresist/polymers layer is not removed completely, the residue affects subsequent processes and debases the quality of the device. Accordingly, it is important to avoid leaving any photoresist/polymers layer residue when the photoresist/polymers layer is removed.

In the conventional photolithography method, integrated circuit patterns transferred on wafers comprises steps of coating a photoresist layer over the wafer. The photoresist layer is sensitive to light and resistant to etching. The image of the master mask is replicated on the photoresist layer by an exposure system to form a photoresist layer. An etching step is performed to form the predetermined pattern on the wafer by using the patterned photoresist layer as an etching mask layer. At present, high-density plasma (HDP) is usually used to perform an anisotropic etching step, and during the etching step, heavy sidewall polymers are deposited to meet etching requirements (e.g. etching selectivity to substrate and profile control etc.). Following the oxide plasma etching, the patterned photoresist layer and sidewall polymer layers are stripped away in-situ. However, during high-density plasma etching, some undesirable residues are generated and accumulated on the surface of the photoresist layer and/or the sidewall of the opening formed by etching. The residues cannot be removed easily by oxygen plasma and leave on the wafer to affect the subsequent processes. The main residues include the following:

1. Cross-linking polymer generated by ultraviolet irradiation is generated on the top surface of the photoresist layer;
2. Silicon-containing polymer is generated while performing the etching step; and
3. The polymers on the sidewall of the opening are generated during etching from the gasses such as $C_4H_8$, $CH_2F_2$, and $C_3H_2F_6$.

The residues often cannot be cleaned by solvents and result in contamination and defects in the following subsequent process. Recently, in order to avoid photoresist residues as mentioned above left on the wafer, a bias is applied to the wafer to enhance the ion bombardment when the oxygen ($O_2$) plasma is performed to remove the photoresist layer.

FIG. 1A is schematic, cross-sectional view of the conventional HDP oxide etcher for removing a photoresist/polymers layer by plasma. FIGS. 1B through 1C are schematic, cross-sectional views of the conventional plasma method for removing a photoresist layer.

As shown in FIG. 1A, a bias is applied on a wafer 114 to enhance the ion bombardment of plasma for removing a photoresist layer 104 (as shown in FIG. 1B).

As shown in FIG. 1B, after an opening 108 is formed, an in-situ oxygen plasma etching step is used to remove the photoresist layer 104 and polymer layer 106. As the residual polymers 106 are generated on the top surface of the photoresist layer 104, it is difficult to strip away the photoresist layer 104 completely.

As shown in FIG. 1C, since the ion bombardment of the oxygen plasma is enhanced, the substrate 100 and an oxide layer 102 underneath the photoresist layer 104 are attacked by the plasma. Accordingly, it is desirable to develop a new method to solve the problems such as the loss of substrate and oxide and an inability to control the critical dimension of the opening during in-situ oxygen plasma etching step.

SUMMARY OF THE INVENTION

It is therefore an objective of the present invention to provide a method for removing a photoresist layer and polymers on the wafer surface without any photoresist residues left.

It is an another objective of the present invention to provide a method for removing a photoresist layer as well as controlling the critical dimension of the openings formed during etching.

To achieve these and other advantages and in accordance with the purpose of the present invention, as embodied and broadly described herein, this invention provides a method for removing photoresist and polymer layer without any residues by using an additional gas mixed with oxygen as a source for in-situ plasma etching. The present method comprises the steps of providing a wafer having an oxide layer, a photoresist layer, an opening penetrating through the photoresist layer and the oxide layer. An in-situ plasma-etching step is performed by using a mixing gases containing oxygen as a source of plasma to remove the photoresist layer.

In a preferred embodiment of the present invention, the gases for mixing with oxygen as a source for plasma etching is selected from the group consisting of nitrogen, hydrogen-containing gas, the combinations thereof and the likes.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
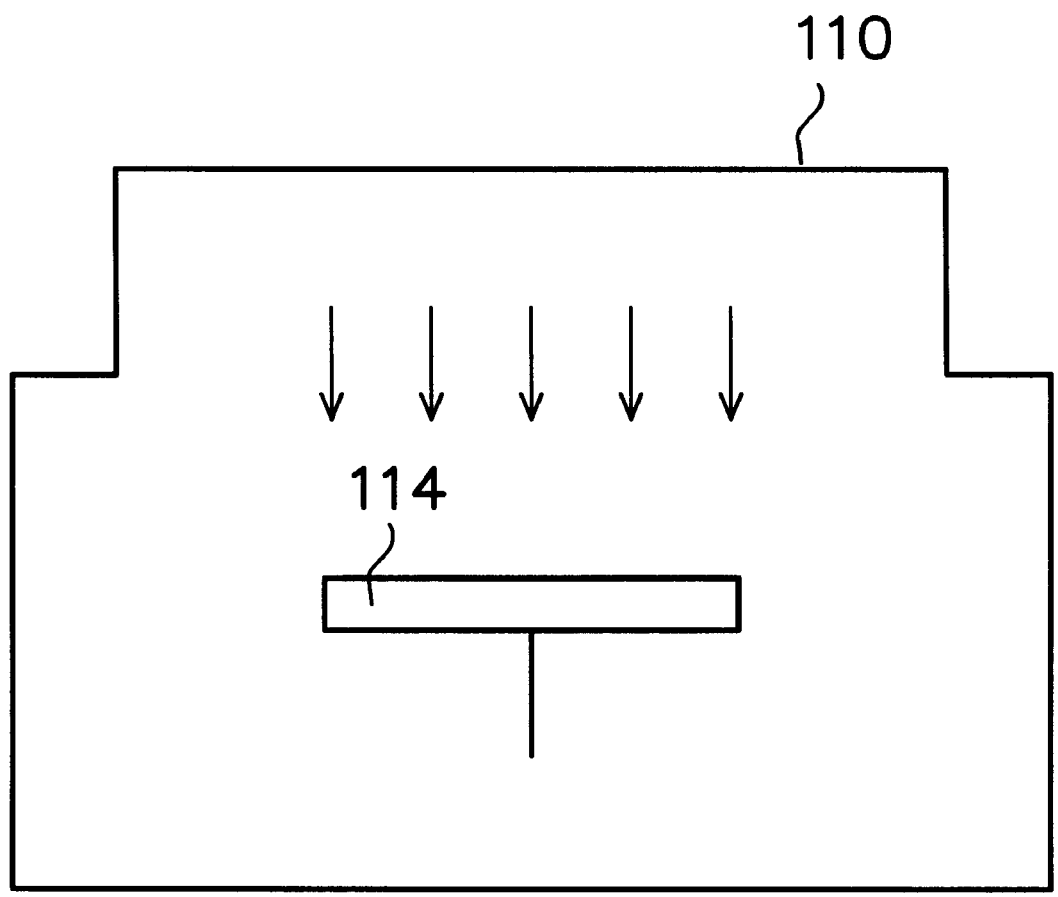
FIG. 1A is a schematic, cross-sectional view of a conventional HDP oxide etcher for removing a photoresist layer by plasma.
Figure 1B:
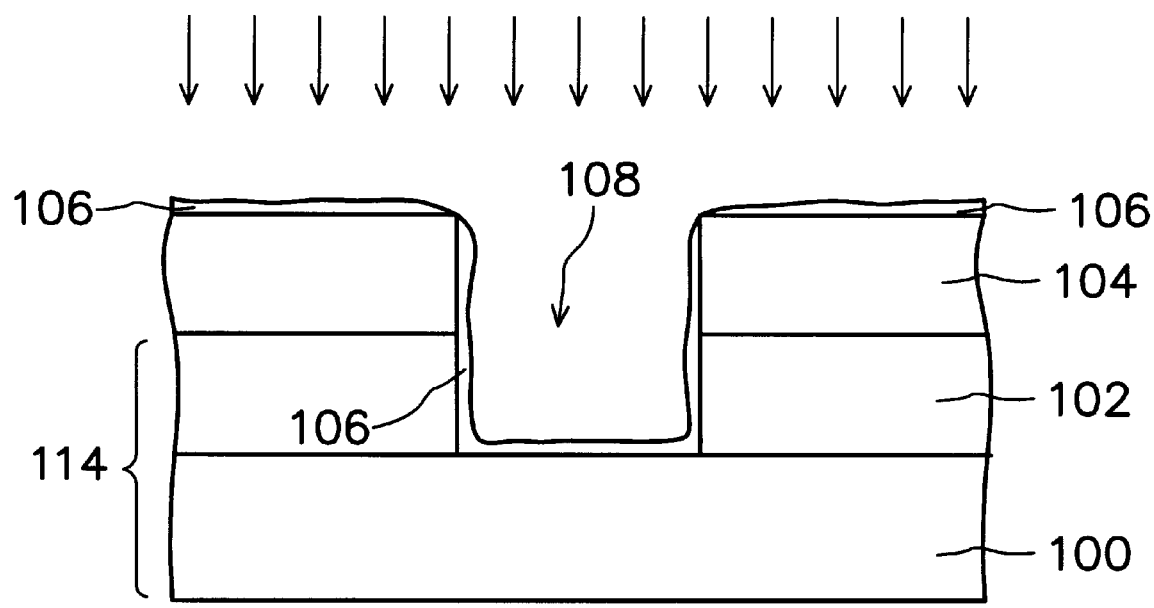
FIGS. 1B through 1C are schematic, cross-sectional views of the conventional plasma method for removing a photoresist layer.
Figure 1C:
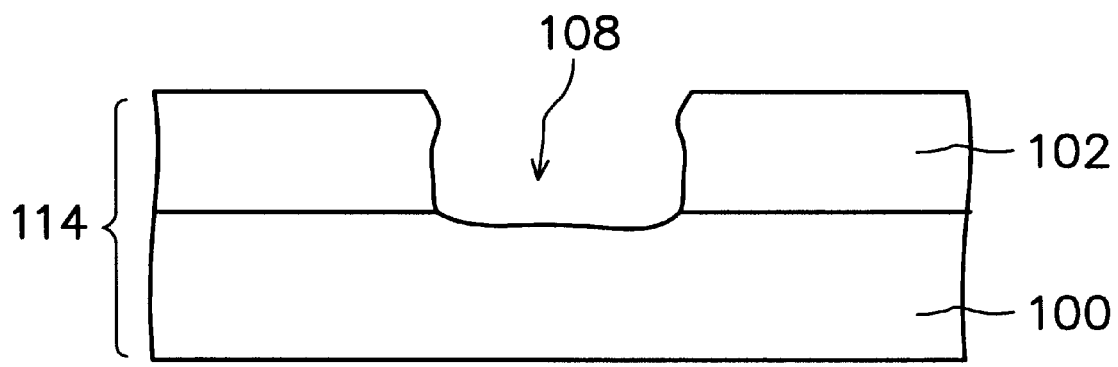

Reference will now be made in detail to the present preferred embodiments of the invention, examples of which are illustrated in the accompanying drawings. Wherever possible, the same reference numbers are used in the drawings and the description to refer to the same or like parts.

Figure 2A:
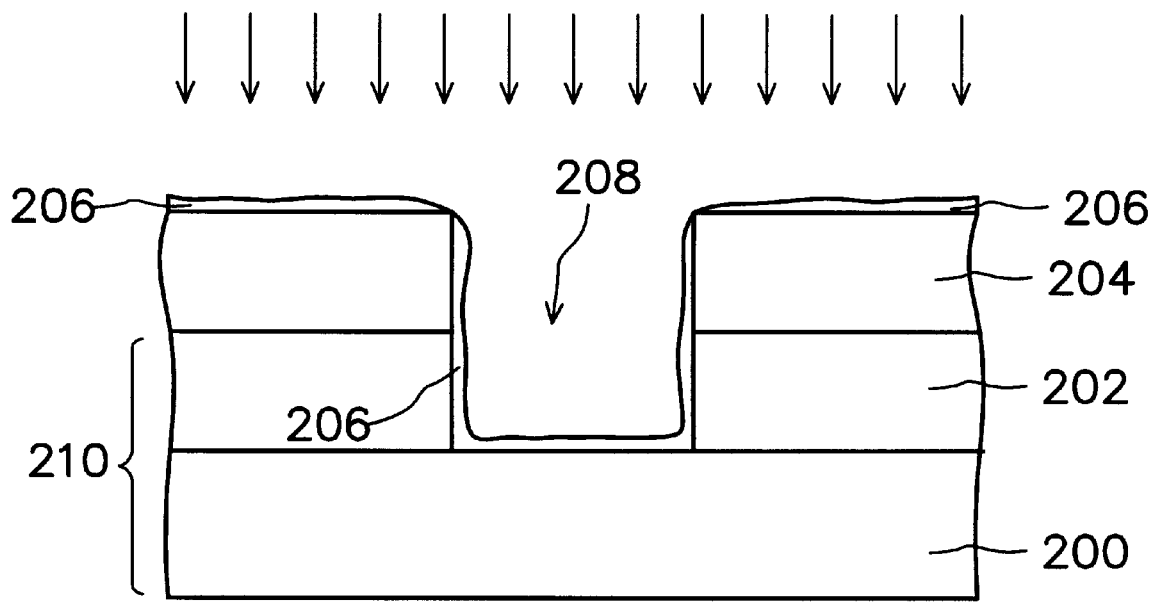
FIGS. 2A through 2B are schematic, cross-sectional views of the plasma method using a mixed gas as source for removing the photoresist and polymer layer in a preferred embodiment according to the present invention.

In FIG. 2A, a wafer 210 having an oxide layer 202 is shown. A photoresist layer 204 is formed on the oxide layer 202. Using an etching step, an opening 208 is formed to penetrate through the photoresist layer 204 and the oxide layer 202 so as to expose a portion of the substrate 200. Consequently, a polymer layer 206 is formed along a surface profile of the opening 208 and covers the photoresist layer 204.

As shown in FIG. 2A, after the opening 208 is formed, an in-situ plasma etching step using an additional gas mixed with oxygen ($O_2$/additional gas) are performed to strip away the photoresist layer 204 and polymer layer 206. Although the polymer 206 is formed on the top surface of the photoresist layer 204 and polymer layer 206 and the sidewall of the opening 208, the plasma using the $O_2$/additional gas as source can efficiently strip away the photoresist layer 204 and polymer layer 206. The examples of $O_2$/additional gas include $O_2/N_2$, $O_2$/hydrogen-containing gases or $O_2/N_2$/hydrogen-containing gases. The preferred volume ratio of gas $N_2$ to $O_2/N_2$ is about 1%~50%. The preferred volume ratio of hydrogen-containing gases to $O_2$/hydrogen-containing gases is about 1%~30%. The preferred volume ratio of hydrogen-containing gases to $O_2/N_2$/hydrogen-containing gases and that of $N_2$ gas to $O_2/N_2$/hydrogen-containing gases are respectively about 1%~30% and 1%~50%. The hydrogen-containing gas can be $CH_2F_2$, $CH_3F$, $C_2H_2F_4$ and $C_3H_2F_6$, for example.

The condition for practicing the method in accordance with the present invention can be varied to optimize for operation. In the preferred embodiment, the conditions for stripping away the photoresist layer 204 and polymer layer 206 are such as a mixing gas flux of about 100 to 3000 standard cubic centimeter per minute (sccm), a mixing gas pressure of about 20 millitorr to 1 torr, an electrical power for generating plasma of about 1000 to 3000 W, a bias power on a wafer (not shown) of about 0 to 300 W, the wafer temperature of about −20° C. to 400° C. and a pressure of helium used as a background gas of about 1 to 100 torr.

Figure 2B:
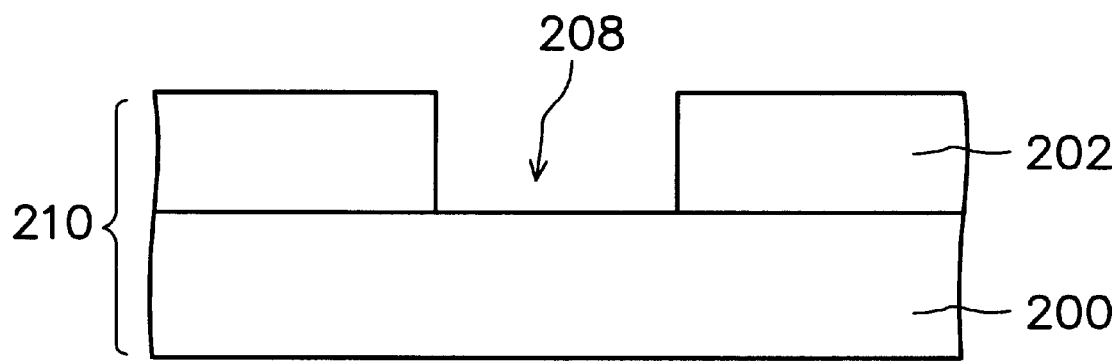

As shown in FIG. 2B, the plasma using mixed gas as source has a high ability to remove the photoresist layer 204 and polymer layer 206, and the bias power applied on the wafer can be reduced, and even eliminated. Accordingly, the bombardment of the plasma to the photoresist layer 204 and polymer layer 206 is moderate, and the substrate 200 and oxide layer 202, which are in the opening 208, do not suffer plasma damage. Therefore, the problems encountered in the conventional method, such as loss of the substrate 200 and oxide layer 202 and loss of control over the critical dimension of the opening 208 can be overcome.

Altogether, the advantages and benefit achieved by the present invention include the following:

1. The present invention provides a method for stripping away the photoresist layer and the polymer layer without residues, and the bias power applied on the wafer can be reduced or even eliminated. The problems such as loss of the substrate and oxide layer and loss of control over the critical dimension of the opening can be overcome.

2. The method of the present invention can be practiced on the conventional devices, thus the present invention is ready to be implemented on current plant lines.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for removing photoresist on a wafer having an oxide layer thereon and a photoresist layer on the oxide layer, the method comprising the steps of:

performing an etching step to form an opening penetrating through the photoresist layer and the oxide layer to expose a portion of the wafer, consequently forming a polymer layer along a surface profile of the opening and covering the photoresist layer;

performing an in-situ plasma etching step using an additional gas mixed with oxygen as a source to remove the photoresist layer and the polymer layer, wherein the step of removing the photoresist layer and the polymer layer is performed under the conditions of:

a combined flux of about 100–3000 sccm for the oxygen gas and additional gas;

a pressure of about 20 millitorr to 1 torr for the oxygen gas and additional gas;

a power of about 1000 to about 3000 W for the in-situ plasma etching step;

a bias power on a wafer of about 0 to about 300 W for the in-situ plasma-etching step;

a wafer temperature of about −20 to about 400 centigrade for removing the photoresist layer and the polymer layer; and a pressure of about 1 to about 100 torr for a helium background gas.

2. The method of claim 1, wherein the additional gas is selected from the group consisting of $N_2$, hydrogen-containing gas and the combination thereof.

3. The method of claim 2, wherein when the additional gas is $N_2$, the ratio of $N_2$ to a combined total amount of the $N_2$ and oxygen gas is about 1% to about 50%.

4. The method of claim 2, wherein when the additional gas is the hydrogen-containing gas, the ratio of hydrogen-containing gas to a combined total amount of hydrogen-containing gas and oxygen gas is about 1% to about 30%.

5. The method of claim 4, wherein the hydrogen-containing gas is selected from the group consisting of $CH_2F_2$, $CH_3F$, $C_2H_2F_4$, $C_3H_2F_6$ and the combinations thereof.

6. The method of claim 2, wherein when the additional gas is the combination of $N_2$ and hydrogen-containing gas, the ratios of hydrogen containing gas and $N_2$ to a combined total amount of oxygen gas, $N_2$, and hydrogen-containing gas are respectively about 1% to about 30% and about 1% to about 50%.

7. The method of claim 6, wherein the hydrogen containing gas is selected from the group consisting essentially of $CH_2F_2$, $CH_3F$, $C_2H_2F_4$, $C_3H_2F_6$ and the combinations thereof.

8. A method for removing photoresist on a wafer having an oxide layer thereon and a photoresist layer on the oxide layer, the method comprising the steps of:

performing an etching step to form an opening penetrating through the photoresist layer and the oxide layer to expose a portion of the wafer, consequently forming a polymer layer along a surface profile of the opening and covering the photoresist layer; and performing an in-situ plasma-etching step using an additional gas mixed with oxygen as a source to remove the photoresist layer and the polymer layer, said additional gas being selected from the group consisting of $N_2$, hydrogen-containing gas, and combinations thereof;

wherein when the additional gas comprises $N_2$, the ratio of $N_2$ to a combined total amount of the additional gas and the oxygen gas is about 1% to about 50%, when the additional gas comprises a hydrogen-containing gas, the ratio of hydrogen-containing gas to a combined total amount of the additional gas and the oxygen gas is about 1% to about 30%, and when the additional gas is a combination of $N_2$ and hydrogen-containing gas, the ratios of hydrogen-containing gas and $N_2$ to a combined total amount of oxygen gas, $N_2$ and hydrogen-containing gas are respectively about 1% to about 30% and about 1% to about 50%.

9. The method of claim 8, wherein the step of removing the photoresist layer and the polymer layer is performed under the conditions of:

a combined flux of about 100–3000 sccm for the oxygen gas and additional gas;

a pressure of about 20 millitorr to 1 torr for the oxygen gas and additional gas;

a power of about 1000 to about 3000 W for the in-situ plasma etching step;

a bias power on a wafer of about 0 to about 300 W for the in-situ plasma-etching step;

a wafer temperature of about −20 to about 400 centigrade for removing the photoresist layer and the polymer layer; and a pressure of about 1 to about 100 torr for a helium background gas.

10. The method of claim 8, wherein the hydrogen-containing gas is selected from the group consisting of $CH_2F_2$, $CH_3F$, $C_2H_2F_4$, $C_3H_2F_6$ and combinations thereof.

* * * * *